United States Patent [19]

Harris et al.

[11] 4,005,472
[45] Jan. 25, 1977

[54] METHOD FOR GOLD PLATING OF METALLIC LAYERS ON SEMICONDUCTIVE DEVICES

[75] Inventors: James M. Harris; William M. Gouin, both of San Jose, Calif.

[73] Assignee: National Semiconductor Corporation, Santa Clara, Calif.

[22] Filed: May 19, 1975

[21] Appl. No.: 578,651

[52] U.S. Cl. .................................. 357/71; 204/15; 427/88; 427/92
[51] Int. Cl.² .................. H01L 29/46; H01L 23/48
[58] Field of Search ............... 204/15, 38 R, 38 S, 204/40; 427/88, 89, 92, 98, 125, 304, 430, 436, 437; 357/68, 71

[56] References Cited

UNITED STATES PATENTS

| 3,099,576 | 7/1963 | Mocann | 427/92 |
|---|---|---|---|
| 3,162,512 | 12/1964 | Robinson | 427/437 |
| 3,214,292 | 10/1965 | Edson | 427/436 |
| 3,436,818 | 4/1969 | Merrin et al. | 357/71 |
| 3,461,357 | 8/1969 | Mutter et al. | 357/71 |
| 3,523,038 | 8/1970 | Sanders | 427/89 |

FOREIGN PATENTS OR APPLICATIONS 698,473  11/1964  Canada .................... 427/98

OTHER PUBLICATIONS

IBM Tech Disclosure Bulletin vol. 8 No. 3 Aug. 1965 p. 452.
RCA Technical Notes RCA June 1960.

*Primary Examiner*—T. M. Tufariello
*Attorney, Agent, or Firm*—Willis E. Higgins; Gail W. Woodward

[57] ABSTRACT

An integrated circuit semiconductive device has a plurality of copper gang bonding bumps formed on the upper surface thereof. The bumps rise substantially above the surface of the semiconductive device and serve to make electrical connection to a pattern of intraconnect metallization formed on the semiconductive device for making electrical contact to various regions within the semiconductive body of the integrated circuit. The gang bonding bumps are to be thermal compression bonded to metallic leads by an automatic bonding machine. As a final step to the processing of the semiconductive wafers, containing the individual semiconductive devices, the wafers are immersed in an immersion gold plating solution for plating an antioxidant protective coating of gold of a thickness less than 6000 angstroms onto the copper gang bonding bumps to prevent oxidation thereof either before or during the gang bonding step. The thickness of such gold antioxidant coating permitting thermal compression bonding therethrough to the underlying metal layer.

6 Claims, 1 Drawing Figure

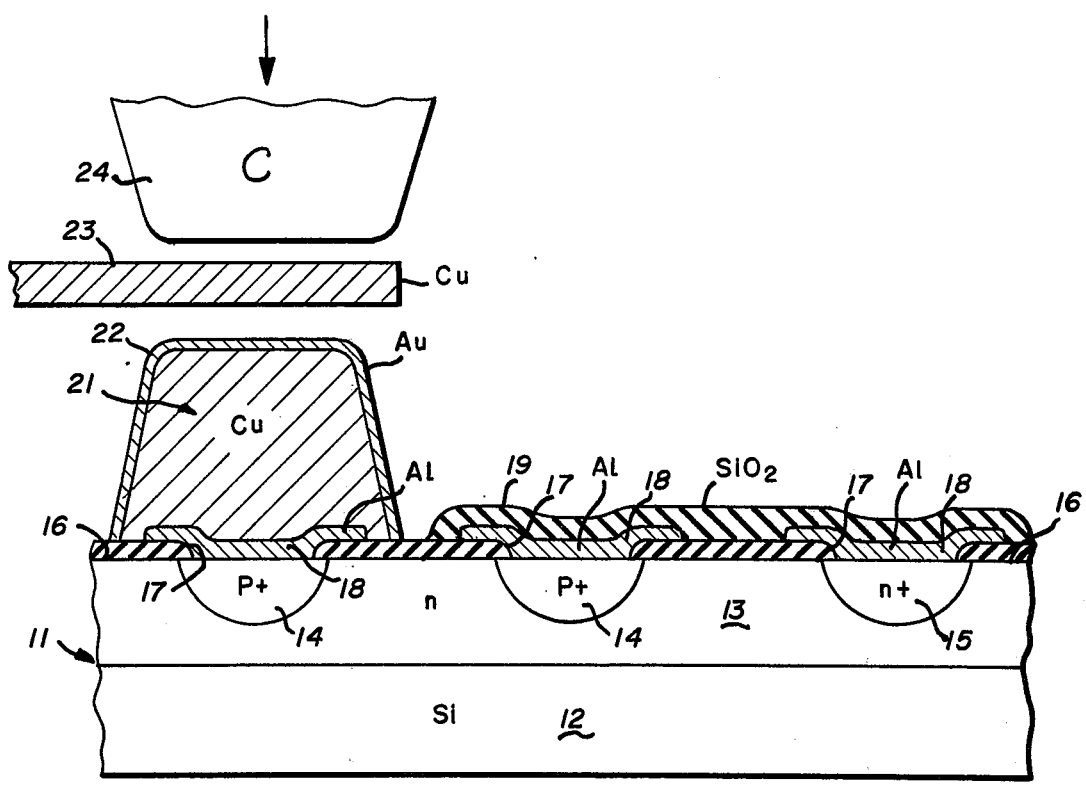

METHOD FOR GOLD PLATING OF METALLIC LAYERS ON SEMICONDUCTIVE DEVICES

BACKGROUND OF THE INVENTION

The present invention relates in general to the formation of antioxidant coatings of gold on exposed patterns of metal on semiconductive devices, and more particularly to an improved method of immersion plating of a gold antioxidant layer over exposed metal parts and particularly copper thermal compression gang bonding bumps formed on such semiconductive devices.

DESCRIPTION OF THE PRIOR ART

Heretofore, it had been proposed to gold plate copper thermal compression gang bonding bumps on semiconductor integrated circuits to provide an antioxidant layer thereon to facilitate thermal compression bonding of copper gang bonding bumps to metallic bonding leads. Such a method for protecting the copper bumps against oxidation is disclosed and claimed in copending U.S. application Ser. No. 582,634 filed June 2, 1975, and assigned to the same assignee as the present invention.

In this prior technique for coating gold over the copper thermal compression gang bonding bumps, the gold was to be applied by electroplating of gold onto the copper bump as a last step in the process of electroplating the copper bumps onto the integrated circuit through apertures in a photoresist layer overlaying the surface of the semiconductive device. Such a technique for applying an antioxidant coating of gold onto the copper thermal compression gang bonding bumps is suitable, however, there are certain disadvantages to performing the gold plating step at this point in the process. One of the disadvantages is that all of the semiconductive wafers are plated with gold before the wafers have been tested. As a consequence gold, which is relatively expensive, is applied to some of the wafers which are later proven to be defective and thus wasted. Also when electroplating gold onto copper, the copper ions will contaminate the gold plating solution and reduce its effectiveness.

SUMMARY OF THE PRESENT INVENTION

The principal object of the present invention is the provision of an improved method for gold plating of exposed metallic portions of semiconductive devices.

In one feature of the present invention, an antioxidant coating of gold is plated by the immersion process onto exposed metallic portions of an integrated circuit semiconductive device.

In another feature of the present invention the exposed metallic portions of the integrated circuit device to be coated with gold comprise a plurality of thermal compression gang bonding bumps rising above the surface of the semiconductive device and making connection at their bases to patterns of metallization on the semiconductive device.

In another feature of the present invention an antioxidant coating of gold of a thickness less than 6000 angstroms is plated onto copper thermal compression gang bonding bumps of a semiconductive integrated circuit device by means of the gold immersion plating process.

Other features and advantages of the present invention will become apparent upon a perusal of the following specification taken in connection with the accompanying drawing wherein:

BRIEF DESCRIPTION OF THE DRAWING

The drawing is a fragmentary cross-sectional view, partly in schematic form, of an integrated circuit semiconductive device employing features of the present invention.

DESCRIPTION OF THE PREFERRED EMBODIMENTS

Referring now to the drawing there is shown a portion of an integrated circuit semiconductive device 11 incorporating features of the present invention. More particularly, the semiconductive device 11 includes a semiconductive body having a substrate region 12, as of silicon, and an n type epitaxial layer 13 grown thereon. A plurality of p+ type regions 14 are diffused into the n type epitaxial layer 13 for providing active semiconductive devices in the integrated circuit device 11. An $n+$ type conductivity region 15 is also diffused into the n type epitaxial layer 13 for making electrical contact thereto.

A silicon dioxide passivating layer 16 is deposited overlaying the n type layer 13. The passivating layer 16 is provided with a multitude of apertures 17 therein for exposing the underlying p+ and n+ type conductivity regions 14 and 15. Electrical contact is made to these underlying regions 14 and 15 via the intermediary of a pattern of intraconnect metallization 18, as of aluminum, evaporated over the first passivating layer 16 and into the openings 17 therein. In certain regions, the intraconnect pattern of metallization 18 extends over the first passivating layer. A second passivating layer 19 as of silicon dioxide is chemically vapor deposited over the intraconnect pattern of metallization 18 for passivating same.

A plurality of thermal compression gang bonding bumps 21, as of copper, and electroplated over selected regions of the pattern of metallization 18 for making electrical connection thereto. The thermal compression bonding bumps 21 rise a substantial distance above the surface of the semiconductor device, such as to a height of 1 to 2 mils and the bumps 21 have a cross-section at their base of, for example, 12 square mils.

The gang bonding bumps 21 are coated with an antioxidant layer of gold 22 to a depth of preferably not in excess of 6000 angstroms. The gold plated copper bumps 21 are thermal compression gang bonded to the ends of a plurality of metallic interconnect lead portions 23 via a thermal compression bonding tool 24, as of carbon, of an automatic gang bonding machine. The tool 24 is heated to a suitable temperature, as of 550° C, and pressure is applied by the tool for squeezing the lead 23 into contact with the gold plated copper bump 21. The gold plating layer 22 is sufficiently thin so that a copper-to-copper bond is obtained between the copper lead 23 and the copper bump 21 through the gold layer. A strong bond is obtained only to the underlying copper, and not to the gold coating 22. The gold layer 22 serves to prevent oxidation of the copper during the heating and thermal compression bonding thereof and during prior processing or storage of the wafers so that a strong bond is obtained between the lead 23 and the underlying copper bump 21.

According to the present invention, the antioxidant coating of gold 22 is immersion plated onto the exposed metallic bumps 21, preferably of copper. The immersion gold plating of the exposed portions of metallization on the semiconductive device 11 is preferably carried out as a last step in the processing of the semiconductive wafer and preferably after testing of the wafers so that gold is not plated onto defective wafers and thereby lost.

Prior to the gold plating step, the completed wafers are first cleaned by immersing the semiconductive wafers in an aqueous solution of five percent by volume $HNO_3$ and 67% by volume phosphoric acid for 10 seconds followed by a rinse in deionised water for 10 minutes. The devices are then placed in the immersion plating solution at 70° C for 10 to 20 minutes for immersion gold plating of the gold layer 22 onto the cleaned and exposed metal portions of the wafers. In the case of gold plated copper bumps, the gold layer 22 is deposited to a thickness of preferably less than 6000 angstroms so that a copper-to-copper bond is obtained between the copper lead 23 and the copper bump 21. A suitable immersion gold plating solution consists of the following: The immersion gold plating solution marketed under the name "Sel-Rex immersion gold I", by Sel-Rex Co. of Nutley, N.J. The solution is made up by dissolving part B of the product in one-half the final volume of deionized water at 65° C and dissolving part A of the product in 200 mils of deionized water at 65° C. Diluted part A is added to diluted part B and further diluted to 2 gallons. The bath is heated to between 60° C and 80° C and the pH thereof adjusted by adding KOH and phosphoric acid for a pH of 5 to 6.5. The item to be gold plated is immersed in the final solution for 15 minutes.

In the immersion gold plating process, the gold plating mechanism is one of oxidation-reduction using the differences in the inherent electropotentials of the gold and metal to be plated as the driving force for depositing the gold onto the surface to be plated. This is to be distinguished from the conventional electroplating process wherein the driving force for plating the metal onto the surface to be coated is provided by an electrical potential established between an anode and cathode.

The advantage to immersion gold plating of the semiconductive wafers in accordance with the present invention is that gold can be applied as a last step in the processing of the wafer so that gold is not wasted on defective wafers, that is, the gold can be applied after the wafers have been tested. Secondly, the plating process is self-limiting so that the gold is not deposited to excessive thickness. That is, the immersion gold plating process is self-limiting so that the thickness of the gold plating is automatically limited to less than 6000 angstroms. Thirdly, the immersion gold plating process limits the gold plating to the exposed metallic portions of the device so that gold is not plated onto the passivating layers or into the silicon scribe lines on the wafer. The gold is plated only onto the copper bumps if they are the only exposed metal portions of the device.

The immersion gold plating process for applying an anticorrosion coating to metallic portions of semiconductive devices is not limited to bipolar devices but is applicable as well to MOS and LED devices.

What is claimed is:

1. In a method for gold plating of an integrated circuit semiconductive device, of the type which includes a plurality of exposed copper thermal compression gang bonding bumps rising above the passivated surface of the semiconductive device and being connected at their bases to an underlying pattern of interconnect metallization, for providing an antioxidant coating of gold on the exposed copper gang bonding bumps without plating of gold nonmetallic portions of the device, the steps of:

applying as a final plating step an immersion gold plating solution to both the exposed copper gang bonding bumps and nonmetallic surface portions of the semiconductive device for plating out of the immersion gold plating solution by a process of oxidation-reduction reaction using the differences inherent in the electropotentials of the gold and the copper of the gang bonding bumps to be plated as the driving force for selectively plating the gold directly onto the copper gang bonding bumps; and maintaining the copper gang bumps in contact with the immersion plating solution only so long as to plate gold onto the copper gang bonding bumps to a thickness less than 6000 angstroms so that the thickness of the gold plating is compatible with thermal compression gang bonding of the copper bumps through the gold plating layer to other lead structures.

2. The method of claim 1 wherein the intraconnect pattern of metallization is covered over by an electrically insulative passivation layer.

3. The method of claim 1 including the step of, cleaning the exposed copper gang bonding bumps of the semiconductive device with an acid bath prior to immersion gold plating thereof.

4. The method of claim 3 wherein the acid bath comprises an aqueous solution of phosphoric acid and nitric acid.

5. The product made according to the method of claim 1.

6. The product made according to the method of claim 3.

* * * * *